United States Patent
Deych et al.

(10) Patent No.: US 10,921,467 B2
(45) Date of Patent: Feb. 16, 2021

(54) DETECTOR ARRAY FOR IMAGING MODALITY

(71) Applicant: ANALOGIC CORPORATION, Peabody, MA (US)

(72) Inventors: Ruvin Deych, Gloucester, MA (US); Vladan Ristanovic, Saugus, MA (US); David Schafer, Rowley, MA (US)

(73) Assignee: Analogic Corporation, Peabody, MA (US)

( * ) Notice: Subject to any disclaimer, the term of this patent is extended or adjusted under 35 U.S.C. 154(b) by 333 days.

(21) Appl. No.: 15/705,664

(22) Filed: Sep. 15, 2017

(65) Prior Publication Data

US 2019/0086559 A1  Mar. 21, 2019

(51) Int. Cl.
  *G01T 1/20*  (2006.01)
  *G01T 1/161*  (2006.01)
  *H01L 27/146*  (2006.01)
  *G01N 23/046*  (2018.01)

(52) U.S. Cl.
  CPC ......... *G01T 1/2018* (2013.01); *G01N 23/046* (2013.01); *G01T 1/161* (2013.01); *G01T 1/2002* (2013.01); *H01L 27/1462* (2013.01); *H01L 27/14663* (2013.01); *G01N 2223/419* (2013.01); *G01N 2223/501* (2013.01); *G01N 2223/505* (2013.01)

(58) Field of Classification Search
  CPC ..... G01T 1/2018; G01T 1/161; G01T 1/2002; G21K 4/00; G01N 23/046; G01N 2223/505; G01N 2223/501; G01N 2223/419; H01L 27/1462; H01L 27/14663
  See application file for complete search history.

(56) References Cited

U.S. PATENT DOCUMENTS

| 5,138,642 A | 8/1992 | McCroskey et al. |
| 5,143,200 A | 9/1992 | Fuller |
| 5,391,879 A * | 2/1995 | Tran ............... G01T 1/2018 250/367 |
| 5,692,507 A | 12/1997 | Seppi et al. |

(Continued)

FOREIGN PATENT DOCUMENTS

| WO | 2016/060667 A1 | 4/2016 |
| WO | 2016/126260 A1 | 8/2016 |

OTHER PUBLICATIONS

Written Opinion of the International Searching Authority for PCT Application No. PCT/US2018/043371 dated Oct. 25, 2018, nine pages.

(Continued)

*Primary Examiner* — Michael C Bryant
(74) *Attorney, Agent, or Firm* — TraskBritt

(57) ABSTRACT

A detector array is provided for detecting radiation photons. The detector array includes a phosphor screen that converts radiation photons into light energy. The detector array includes a photodiode array having a plurality of photodiodes that convert the light energy into electrical charge. A first photodiode of the plurality of photodiodes is spaced apart from a second photodiode of the plurality of photodiodes to define a non-detection region. The phosphor screen overlies the first photodiode, the second photodiode, and the non-detection region between the first photodiode and the second photodiode.

19 Claims, 6 Drawing Sheets

(56) References Cited

U.S. PATENT DOCUMENTS

| | | | |
|---|---|---|---|
| 5,978,108 A | 11/1999 | Bai et al. | |
| 6,510,195 B1* | 1/2003 | Chappo | G01T 1/2018 |
| | | | 250/208.1 |
| 7,161,155 B1* | 1/2007 | Deych | G01T 1/2018 |
| | | | 250/370.11 |
| 7,569,832 B2* | 8/2009 | Tredwell | G01T 1/2018 |
| | | | 250/370.11 |
| 2008/0292050 A1 | 11/2008 | Goodenough et al. | |
| 2009/0050817 A1* | 2/2009 | Horiuchi | H01L 27/1462 |
| | | | 250/370.11 |
| 2011/0006213 A1* | 1/2011 | Sato | G01T 1/2018 |
| | | | 250/367 |
| 2012/0217605 A1* | 8/2012 | Kunikiyo | H01L 27/14603 |
| | | | 257/443 |
| 2013/0019462 A1* | 1/2013 | Shoji | G01T 1/2018 |
| | | | 29/595 |
| 2017/0248705 A1* | 8/2017 | Deych | G01N 23/046 |
| 2018/0267178 A1* | 9/2018 | Kurebayashi | G01T 1/2018 |
| 2019/0179039 A1* | 6/2019 | Kim | G01T 1/2018 |

OTHER PUBLICATIONS van Eijk, C.W.E., "Inorganic Scintillators in Medical Imaging Detectors," Nuclear Instruments & Methods in Physics Research, Section A, 509, 2003, Elsevier Science B.V., pp. 17-25.

International Search Report for PCT Application No. PCT/US2018/043371 dated Oct. 25, 2018, five pages.

* cited by examiner

DETECTOR ARRAY FOR IMAGING MODALITY

BACKGROUND

Technical Field

The present application relates to a radiation detector array having a phosphor screen that extends substantially continuously over a photodiode array. It finds particular application in the field of computed tomography (CT) imaging utilized in security and/or industrial applications, for example.

Today, CT imaging modalities are useful to provide information, or images, of interior aspects of an object under examination. Generally, the object is exposed to radiation (e.g., x-rays, gamma rays, etc.), and an image(s) is formed based upon the radiation absorbed and/or attenuated by the interior aspects of the object, or rather an amount of radiation photons that is able to pass through the object. Typically, highly dense aspects of the object (or aspects of the object having a composition comprised of higher atomic number elements) absorb and/or attenuate more radiation than less dense aspects, and thus an aspect having a higher density (and/or high atomic number elements), such as a bone or metal, for example, will be apparent when surrounded by less dense aspects, such as muscle or clothing.

Radiation imaging modalities generally comprise, among other things, one or more radiation sources (e.g., an x-ray source, Gamma-ray source, etc.) and a detector array comprised of a plurality of channels (also referred to as detector cells) that are respectively configured to convert radiation that has traversed the object into signals that may be processed to produce the image(s). As an object is passed through an examination region defined between the radiation source(s) and the detector array, radiation is absorbed/attenuated by the object, causing changes in the amount/energy of radiation detected by the detector array.

Detector arrays may be configured to directly or indirectly convert radiation energy into electrical energy. Commonly, indirect conversion detector arrays include a crystalline or ceramic scintillator that is precision diced to create a two-dimensional array of channels, each channel separated by a reflective material. This two-dimensional scintillator array is coupled to match a two-dimensional array of photodiodes underlying the two-dimensional scintillator array. This method of coupling the scintillator array and the photodiode array generally requires precision fixtures and/or processes to ensure proper alignment. Imprecise alignment can lead to a number of problems, including a lower fidelity image, for example.

BRIEF SUMMARY

Aspects of the present application address the above matters, and others. According to one aspect, a computed tomography (CT) imaging modality comprises a stator, a rotor configured to rotate relative to the stator, and a detector array coupled to one of the stator or the rotor and configured to detect radiation photons. The detector array comprises a phosphor screen configured to convert the radiation photons into light energy, and a photodiode array comprising a plurality of photodiodes configured to convert the light energy into electrical charge. A first photodiode of the plurality of photodiodes is spaced apart from a second photodiode of the plurality of photodiodes to define a non-detection region. The phosphor screen overlies the first photodiode, the second photodiode, and the non-detection region between the first photodiode and the second photodiode.

According to another aspect, a computed tomography (CT) imaging modality comprises a stator, a rotor configured to rotate relative to the stator, and a radiation source configured to emit radiation photons. The radiation source is coupled to the rotor. A detector array is coupled to the rotor and is configured to detect the radiation photons. The detector array comprises a phosphor screen configured to convert the radiation photons into light energy and a photodiode array comprising a plurality of photodiodes configured to convert the light energy into electrical charge. A first photodiode of the plurality of photodiodes is spaced apart from a second photodiode of the plurality of photodiodes to define a non-detection region. The phosphor screen is disposed substantially continuously over the first photodiode, the second photodiode, and the non-detection region between the first photodiode and the second photodiode.

According to another aspect, a computed tomography (CT) imaging modality comprises a stator, a rotor configured to rotate relative to the stator, and a radiation source configured to emit radiation photons. The radiation source is coupled to the rotor. A detector array is coupled to the rotor and is configured to detect the radiation photons. The detector array comprises a phosphor screen configured to convert the radiation photons into light energy and a photodiode array comprising a plurality of photodiodes configured to convert the light energy into electrical charge.

Those of ordinary skill in the art will appreciate still other aspects of the present application upon reading and understanding the appended description.

BRIEF DESCRIPTION OF THE DRAWINGS

The application is illustrated by way of example and not limitation in the figures of the accompanying drawings, in which like references generally indicate similar elements and in which.

DETAILED DESCRIPTION

Figure 1:
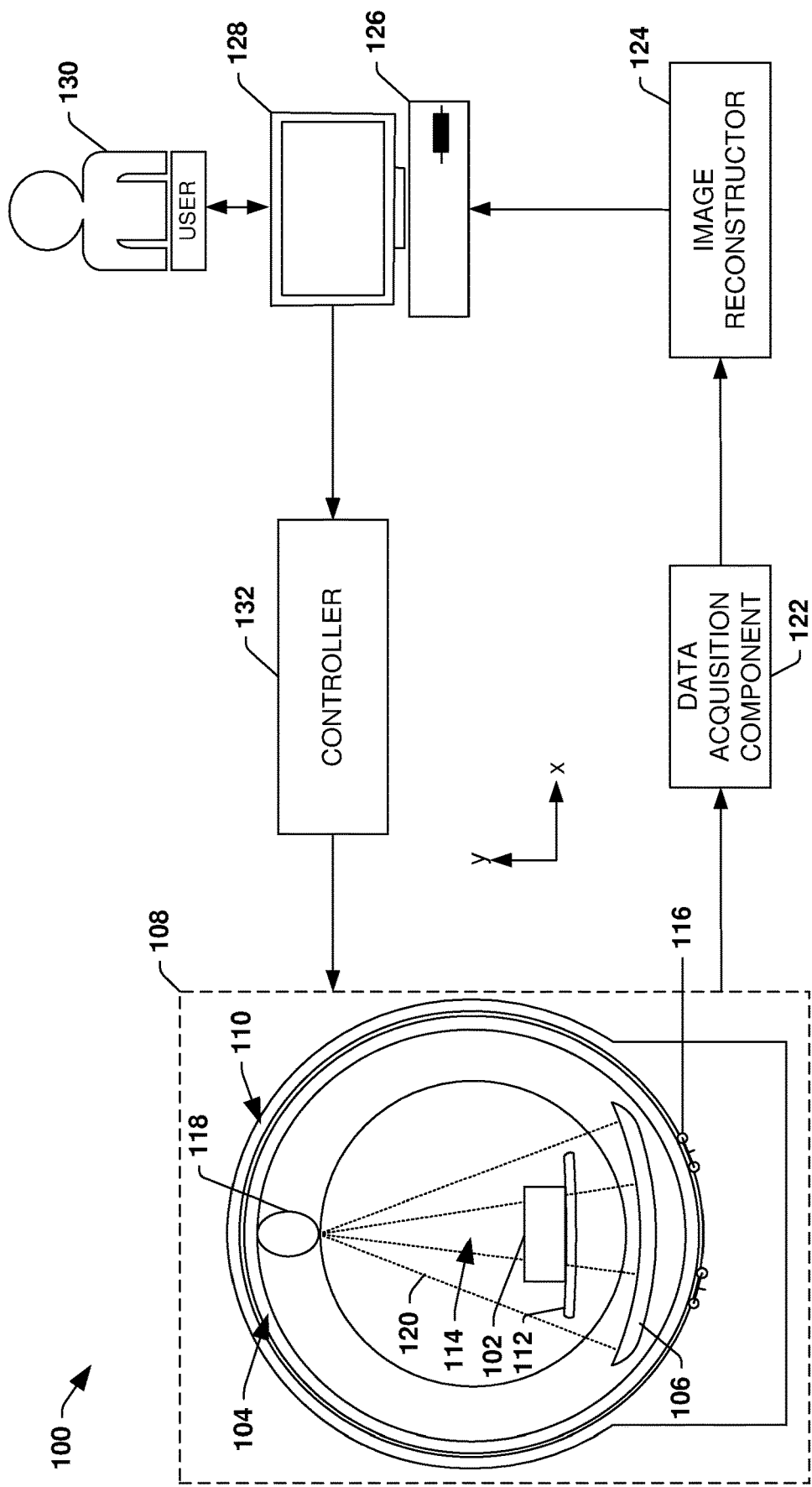
FIG. 1 illustrates an example environment of an imaging modality.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

The present disclosure relates to a detector array that is configured to detect radiation photons. The detector array comprises a phosphor screen that converts radiation photons into light energy. A photodiode array comprises a plurality of photodiodes that convert the light energy into electrical charge. A first photodiode of the plurality of photodiodes is spaced apart from a second photodiode of the plurality of photodiodes. In this way, a non-detection region is defined between the first photodiode and the second photodiode. The non-detection region may be a physical gap between the two photodiodes (e.g., due to the first photodiode being formed on a first semiconductor wafer and the second photodiode being formed on a second semiconductor wafer that is disposed adjacent the first semiconductor wafer to form the detector array) or may be a non-active region disposed between two p-n junctions on a same semiconductor wafer).

The phosphor screen overlies the first photodiode, the second photodiode, and the non-detection region. In some embodiments, the phosphor (e.g., columnar CsI—Tl, $Gd_2O_2S:Pr$, $Gd_2O_2S:Tb$, $Gd_2O_2S:Eu$, $CaWO_4$, $BaFCl:Eu$) of the phosphor screen can be directly deposited on the surface of the photodiodes (e.g., a two-dimensional thin film transistor (TFT) matrix.

In some embodiments, there is no reflective material between a first portion of the phosphor screen over the first photodiode and a second portion of the phosphor screen over the second photodiode. As such, alignment requirements for aligning the phosphor screen (i.e., a conversion layer or scintillator layer) with the photodiode array is reduced, lower manufacturing costs and manufacturing complexity while maintaining an acceptable image quality. In this way, ease of assembling the detector array is improved. As such, the present disclosure can provide an economical detector for a security CT imaging system comprising an indirect integrating x-ray detector based on a phosphor (fluorescent) screen material and photodiode array.

While phosphor powder based screens may not simultaneously achieve high spatial resolution and high x-ray absorption due to light blurring in thicker powder layers, these screens may be used in security CT imaging, which has relatively low spatial resolution (e.g., in the range of about 1 millimeter). Moreover, the loss of x-ray absorption in phosphor screens can be compensated by increasing the x-ray intensity, if needed.

FIG. 1 is an illustration of an example environment 100 comprising an example radiation imaging modality that may be configured to generate data (e.g., images) representative of an object 102 or aspect(s) thereof under examination. It will be appreciated that the arrangement of components and/or the types of components included in the example environment 100 are for illustrative purposes only.

In the example environment 100, an examination unit 108 of the imaging modality is configured to examine one or more objects 102. The examination unit 108 can comprise a rotor 104 and a stator 110 (e.g., which may encase and/or surround as least a portion of the rotor 104 (e.g., as illustrated with an outer, stationary ring, surrounding an outside edge of an inner, rotating ring)). During an examination of the object(s) 102, the object(s) 102 can be placed on a support article 112, such as a bed or conveyor belt, for example, that is selectively positioned in an examination region 114 (e.g., a hollow bore in the rotor 104), and the rotor 104 can be rotated and/or supported about the object(s) 102 by a rotator 116, such as a motor, drive shaft, chain, roller truck, etc.

The rotor 104 may surround a portion of the examination region 114 and may comprise one or more radiation sources 118 (e.g., an ionizing x-ray source, gamma radiation source, etc.) and a detector array 106, comprised of a plurality of channels (e.g., also referred to as detector cells), that is mounted on a substantially diametrically opposite side of the rotor 104 relative to the radiation source(s) 118.

During an examination of the object(s) 102, the radiation source(s) 118 emits fan, cone, wedge, and/or other shaped radiation 120 configurations from a focal spot(s) of the radiation source(s) 118 (e.g., a point within the radiation source(s) 118 from which radiation 120 emanates) into the examination region 114. It will be appreciated that such radiation 120 may be emitted substantially continuously and/or may be emitted intermittently (e.g., a brief pulse of radiation is emitted followed by a resting period during which the radiation source 118 is not activated).

As the emitted radiation 120 traverses the object(s) 102, the radiation 120 may be attenuated differently by different aspects of the object(s) 102. Because different aspects attenuate different percentages of the radiation 120, an image(s) may be generated based upon the attenuation, or variations in the number of photons that are detected by the detector array 106. For example, more dense aspects of the object(s) 102, such as a bone or metal plate, may attenuate more of the radiation 120 (e.g., causing fewer photons to strike the detector array 106) than less dense aspects, such as skin or clothing.

The detector array 106 comprises a plurality of channels disposed as a single row/column or multiple rows/columns. The channels indirectly convert detected radiation into analog signals.

Signals that are produced by the detector array 106 may be transmitted to a data acquisition component 122 that is in operable communication with the detector array 106 (e.g., and at least portions of which may be coupled to and/or comprised within at least some of the channels of the detector array 106). Typically, the data acquisition component 122 is configured to convert the electrical signals output by respective channels of the detector array into digital data and/or to combine the digital data acquired during a measuring interval. The collection of digital output signals for a measuring interval may be referred to as a "projection" or a "view". Moreover, an angular orientation of the rotor 104 (e.g., and the corresponding angular orientations of the radiation source(s) 118 and the detector array 106) relative to the object(s) 102 and/or support article 112, for example, during generation of a projection may be referred to as the "projection angle."

The example environment 100 also illustrates an image reconstructor 124 that is operably coupled to the data acquisition component 122 and is configured to generate one or more images representative of the object 102 under examination based at least in part upon signals output from the data acquisition component 122 using suitable analytical, iterative, and/or other reconstruction technique (e.g., tomosynthesis reconstruction, back-projection, iterative reconstruction, etc.). Such images may be 3D images and/or 2D images.

The example environment 100 also includes a terminal 126, or workstation (e.g., a computer), configured to receive image(s) from the image reconstructor 124, which can be displayed on a monitor 128 to a user 130 (e.g., security personnel, medical personnel, etc.). In this way, the user 130 can inspect the image(s) to identify areas of interest within the object(s) 102. The terminal 126 can also be configured to receive user input which can direct operations of the examination unit 108 (e.g., a speed of rotor rotation, an energy level of the radiation, etc.).

In the example environment 100, a controller 132 is operably coupled to the terminal 126. In an example, the controller 132 is configured to receive user input from the terminal 126 and generate instructions for the examination unit 108 indicative of operations to be performed.

It will be appreciated that the example component diagram is merely intended to illustrate one embodiment of one type of imaging modality and is not intended to be interpreted in a limiting manner. For example, the functions of one or more components described herein may be separated into a plurality of components and/or the functions of two or more components described herein may be consolidated into merely a single component. Moreover, the imaging modality may comprise additional components to perform additional features, functions, etc. (e.g., such as automatic threat detection).

Figure 2:
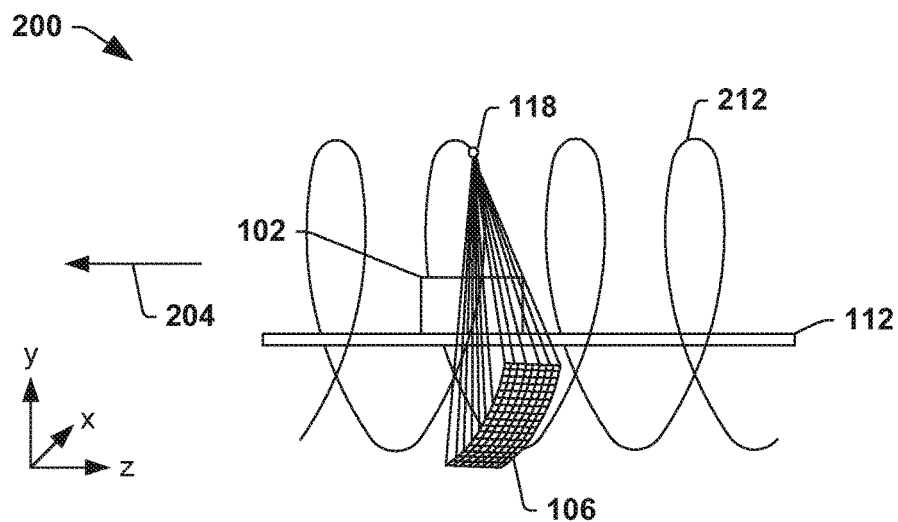
FIG. 2 illustrates a functional diagram of a helical CT imaging modality.

FIG. 2 is a functional diagram 200 of a helical CT imaging modality. In such an imaging modality, the object 102 under examination is translated 204 (typically at a constant speed) along an axis (e.g., z-axis) via the support article 112. Typically, while the object 102 is being translated, one or more radiation sources 118 and/or the detector array 106 are rotated about the object 102 (in an x and/or y direction), causing the radiation source(s) 118 and/or the detector array 106 to follow a spiral- or helical-like trajectory 212 relative to the object 102 (e.g., where the source and detector array do not move in the z direction, and thus the helical trajectory is established by the combination of the x/y rotation of the source and detector array and the z-axis translation of the object). However, in another embodiments the one or more radiation sources 118 and/or the detector array 106 are stationary while the object 102 is further rotated relative to the one or more radiation sources 118 and the detector array 106. Moreover, in some embodiments, the one or more radiation sources 118 and/or the detector array 106 may be translated relative to the object 102.

Figure 3:
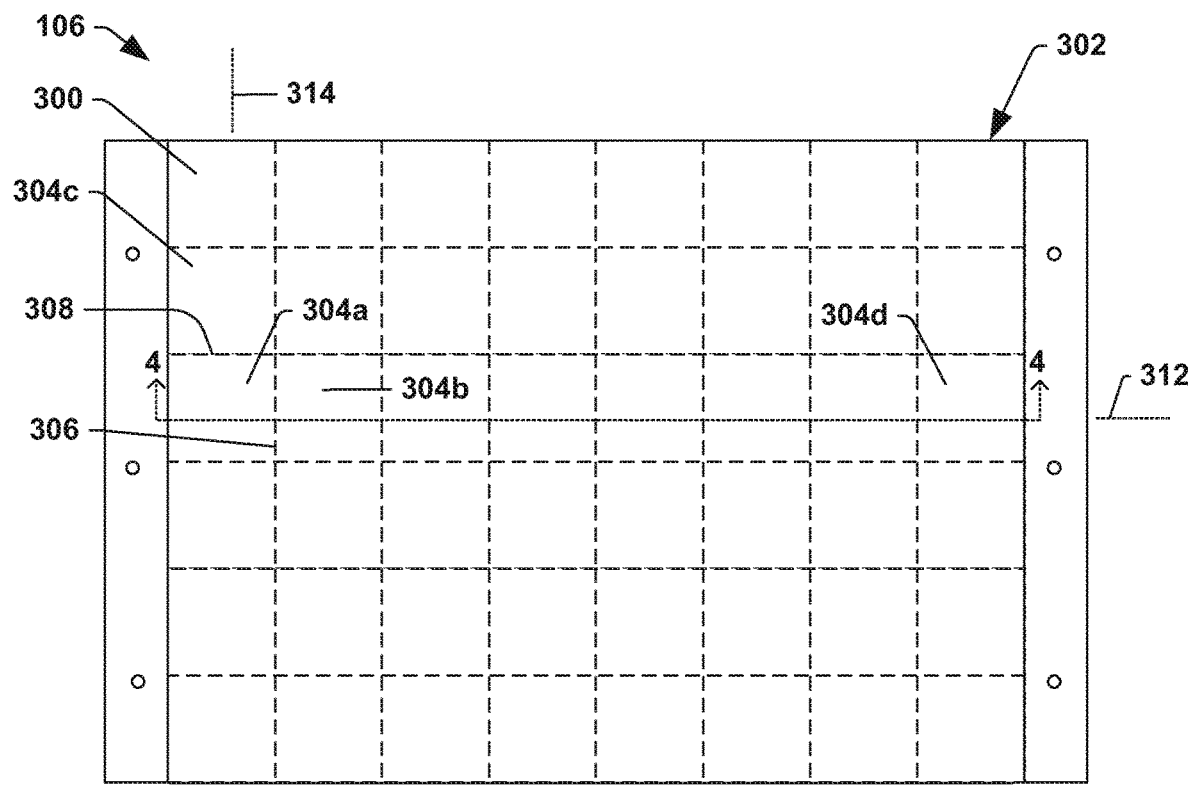
FIG. 3 illustrates a top down view of a portion of an example detector array.

FIG. 3 illustrates a top down view of a portion of the detector array 106. The detector array 106 can be coupled to one of the stator 110 or the rotor 104 and is configured to detect radiation photons. In the embodiment illustrated in FIG. 1, the radiation source 118 and the detector array 106 are coupled to the rotor 104.

The detector array 106 may comprise a phosphor screen 300 that overlies a two-dimensional photodiode array 302. As explained below, the phosphor screen 300 is configured to convert radiation photons into light energy. The photodiode array 302 that underlies the phosphor screen 300 can detect and convert the light energy into electrical charge. The photodiode array 302 may comprise a plurality of photodiodes 304. It will be appreciated that the photodiodes 304 are illustrated with dashed lines in FIG. 3 as the photodiodes 304 are located underneath the phosphor screen 300 and may normally be obstructed from view from the perspective illustrated in FIG. 3. In this way, the dashed lines of FIG. 3 illustrate a space between adjacent photodiodes 304, as the phosphor screen 300 may extend substantially continuously over the photodiode array 302.

In an example, the photodiode array 302 comprises a first photodiode 304a, a second photodiode 304b, a third photodiode 304c, and a fourth photodiode 304d. The second photodiode 304b may be spaced apart from the first photodiode of the plurality of photodiodes 304 to define a non-detection region 306. In an example, the first photodiode 304a, the second photodiode 304b, and the fourth photodiode 304d may be arranged along a first axis 312. In this way, the first photodiode 304a, the second photodiode 304b, and the fourth photodiode 304d can form a portion of a row of photodiodes of the photodiode array 302.

In an example, the third photodiode 304c of the plurality of photodiodes 304 may be spaced apart from the first photodiode 304a of the plurality of photodiodes 304 to define a second non-detection region 308. It will be appreciated that by being spaced apart, gaps/spaces may be within channels of a single chip, and may not necessarily be between different chips. In an example, within a monolithic silicon wafer, there may exist regions of doping that define one or more photodiodes. A photodiode may comprise a p-n junction (e.g., the interface between a p-type material and an n-type material). A gap/space may be disposed adjacent to the p-n junction. A second p-n junction may be disposed adjacent to the gap/space. In this way, two p-n junctions may be separated by a gap or space. Thus, the usage of the terms gap and space is not necessarily meant to imply that the two photodiodes are separated by a physical air-gap. Although, in some embodiments, the first photodiode may be formed within a first semiconductor wafer and the second photodiode may be formed within a second semiconductor wafer that abut the first semiconductor wafer. In such an embodiment, where the first photodiode and the second photodiode are formed on different wafers, a physical air-gap may be present between the first photodiode and the second photodiode.

The first photodiode 304a and the third photodiode 304c may be arranged along a second axis 314. In an example, the second axis 314 may be non-parallel to the first axis 312. In an example, the second axis 314 may be perpendicular to the first axis 312. In this way, the first photodiode 304a and the third photodiode 304c can form a portion of a column of photodiodes of the photodiode array 302. Accordingly, in an example, the photodiode array 302 may comprise one or more rows of photodiodes 304 (e.g., first photodiode 304a, second photodiode 304b, fourth photodiode 304d, etc. forming a portion of a row along the first axis 312) and one or more columns of photodiodes 304 (e.g., first photodiode 304a and third photodiode 304c forming a portion of a column along the second axis 314).

Figure 4A:
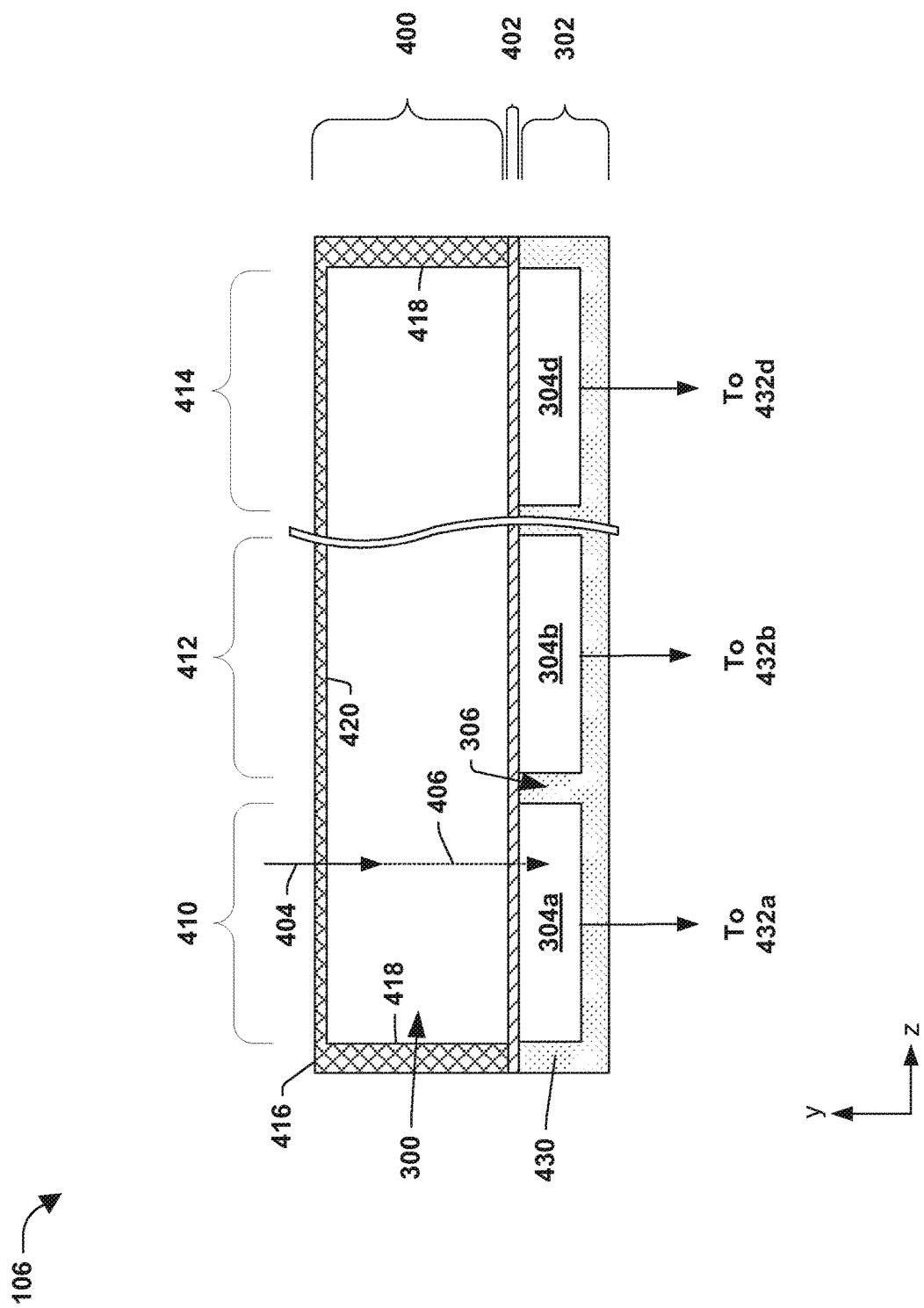
FIG. 4A illustrates a sectional view of a portion of an example detector array.
Figure 4B:
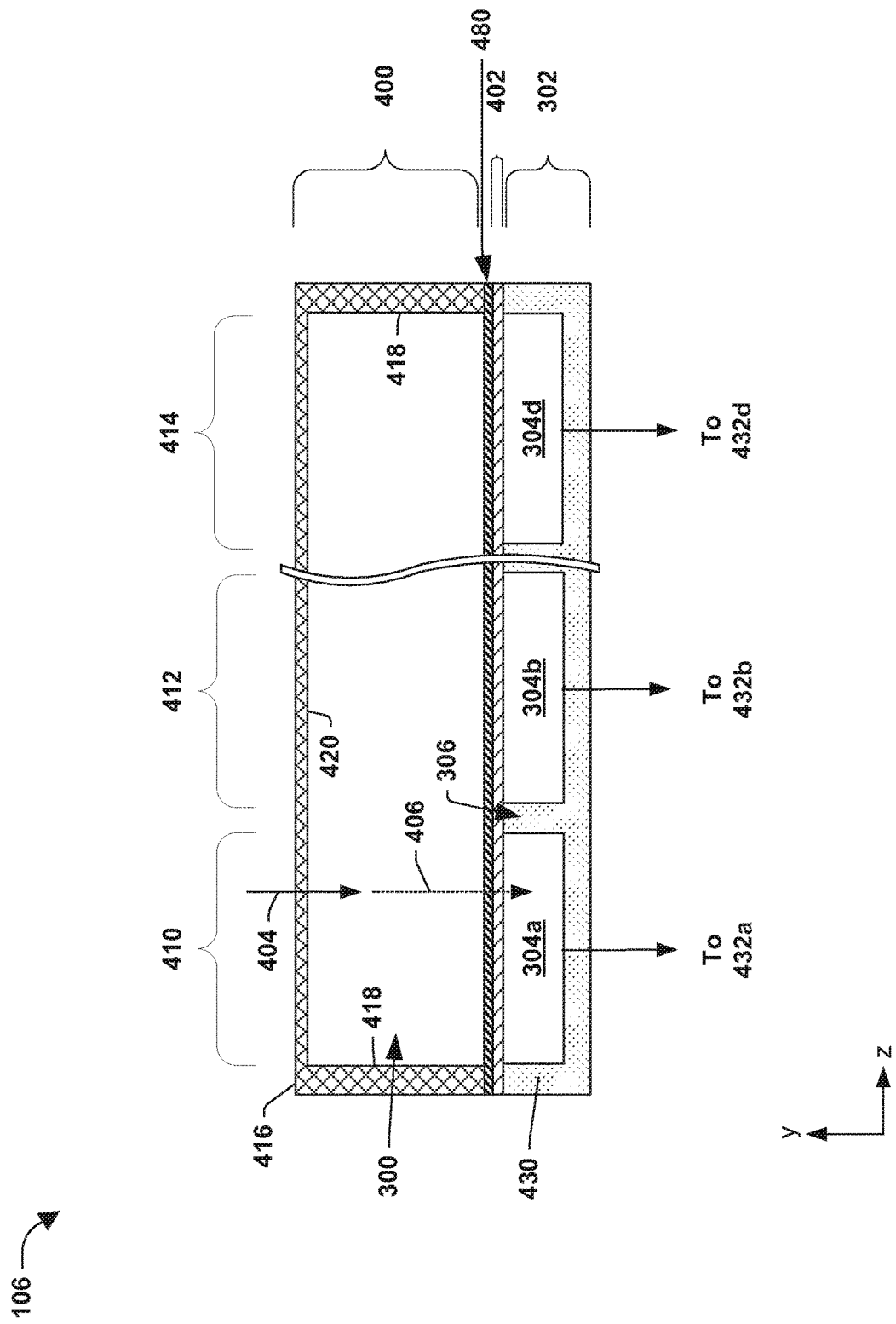
FIG. 4B illustrates a sectional view of a portion of an example detector array.
Figure 4C:
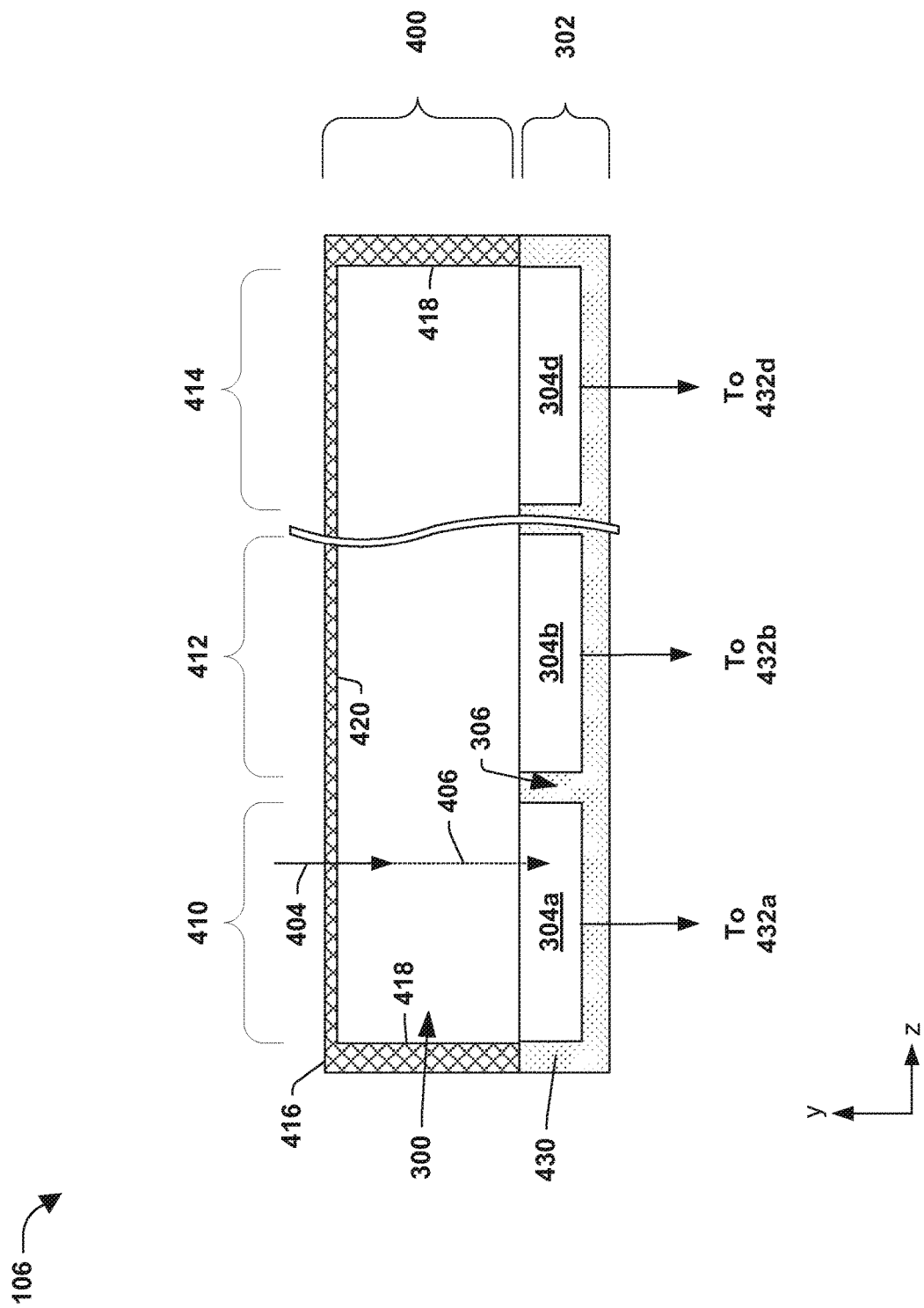
FIG. 4C illustrates a sectional view of a portion of an example detector array.

Turning to FIG. 4A, a sectional view of a portion of the detector array 106 is illustrated as viewed from the perspective indicated by lines 4-4 of FIG. 3. The detector array 106 comprises a conversion layer 400, an adhesion layer 402, and the photodiode array 302. The adhesion layer 402 can bond or otherwise couple the conversion layer 400 and the photodiode array 302. It will be appreciated that, in an example (e.g., as illustrated in FIG. 4C), the adhesion layer 402 may not be provided, such that the conversion layer 400 may be bonded or otherwise coupled directly to the photodiode array 302.

In an example, the conversion layer 400 comprises the phosphor screen 300 that is configured to convert a radiation photon 404 into light energy 406. In an example, the conversion layer 400 may comprise a scintillator that is configured to convert the radiation photon 404 into light energy 406, wherein the scintillator comprises a phosphor material.

While the phosphor screen 300 comprises any number of phosphor materials, the phosphor screen 300 material(s) may be selected based on factors such as a short decay time, low afterglow, sufficiently high quantum efficiency, a sufficiently high spatial resolution, etc. In some examples, the phosphor screen 300 comprises different area densities, which allows for more or less x-ray stopping power, thus facilitating multiple applications (e.g., dual energy detection capability). In an example, the phosphor screen 300 comprises $Gd_2O_2S:Pr$. In another example, the phosphor screen 300 comprises $Gd_2O_2S:Tb$. Due to the nature of the material of the phosphor screen 300, lateral transmission (e.g., left-to-right on the page) of the radiation photons 404 and the light energy 406 is reduced and/or limited. In an example, when the phosphor screen 300 comprises $Gd_2O_2S:Pr$, the phosphor screen 300 may have a decay time of between about 2 microseconds to about 4 microseconds, or about 3 microseconds. The $Gd_2O_2S:Pr$ phosphor screen 300 can have a quantum efficiency of between about 65% to about 85% at 160 peak kilovoltage (kVp), or about 75%. The $Gd_2O_2S:Pr$ phosphor screen 300 can have an afterglow that is less than about 1000 parts-per-million (ppm), along with a sufficiently high modulation transfer function (MTF). In an example, the phosphor screen 300 can have an area density in the range of about 50 to about 500 $mg/cm^2$.

In an example, the phosphor screen material, also referred to as fluorescent screens or phosphor sheets, may be prepared by coating phosphor powders with a binder onto a reflective plastic base. The screen side that faces towards the photodetector can have a relatively thin transparent protective film coating (e.g., 480 illustrated in FIG. 4B). Referring briefly to FIG. 4B, in an example, the transparent protective film coating 480 can be disposed between and/or in contact with the phosphor screen 300 and the adhesion layer 402. In another example, the detector array 106 may not comprise the adhesion layer 402, in which case the transparent protective film coating 480 may be disposed between and/or in contact with the phosphor screen 300 and the photodiode array 302. Phosphor screens are low cost materials, as compared to dense crystalline or ceramic scintillators, and scintillator arrays manufactured from crystalline or ceramic scintillator materials.

Referring to FIG. 4A, the phosphor screen 300 comprises any number of thicknesses depending on a number of factors, including a balance of resolution and quantum efficiency. In an example, quantum efficiency may apply to a ratio of detected radiation photons to incident radiation photons. A thicker phosphor screen 300 may allow for higher absorption of radiation photons while lowering resolution. A thinner phosphor screen 300 may improve resolution while lowering absorption of radiation photons.

In an example the phosphor screen 300 can be substantially continuously distributed over the photodiode array 302. For example, a first portion 410 of the phosphor screen 300 can overlie the first photodiode 304a. In an example, a second portion 412 of the phosphor screen 300 can overlie the second photodiode 304b. A fourth portion 414 of the phosphor screen 300 can overlie the fourth photodiode 304d. In this way, in an example, there may be no dice lines, separating marks, reflective material, etc. between portions of the phosphor screen 300, such as the first portion 410, the second portion 412, the fourth portion 414, etc.

It will be appreciated that FIG. 4A illustrates only the first portion 410, the second portion 412, and the fourth portion 414 of the phosphor screen 300, and the first photodiode 304a, the second photodiode 304b, and the fourth photodiode 304d of the photodiode array 302. In operation, the detector array 106 may have a larger footprint (e.g., dimension along the z-axis) than as illustrated. Indeed, in an example, additional photodiodes may be provided between the second photodiode 304b and the fourth photodiode 304d, such that the phosphor screen 300 can comprise additional material between the second portion 412 and the fourth portion 414. As such, the wavy line between the second portion 412 and the fourth portion 414 and between the second photodiode 304b and the fourth photodiode 304d is intended to illustrate that additional photodiodes and/or phosphor material may be provided.

The conversion layer 400 may comprise a reflective material 416 that at least partially surrounds the phosphor screen 300. In an example, the reflective material 416 can reduce and/or limit light energy that is generated within the phosphor screen 300 from exiting the phosphor screen 300 without interacting with the photodiode array 302. In an example, the reflective material 416 may or may not be disposed on lateral surfaces 418 of the phosphor screen 300. The reflective material 416 may be disposed on an upper surface 420 of the phosphor screen 300. In this way, the reflective material 416 can increase detector efficiency by reducing and/or limiting the loss of light energy associated with radiation photons escaping the phosphor screen.

In an example, while the reflective material 416 may be disposed on one or more of the lateral surface 418 and the upper surface 420, there may be no reflective material 416 between the first portion 410 of the phosphor screen 300 over the first photodiode 304a and the second portion 412 of the phosphor screen 300 over the second photodiode 304b. Likewise, there may be no reflective material 416 between the second portion 412 of the phosphor screen 300 over the second photodiode 304b and the fourth portion 414 of the phosphor screen 300 over the fourth photodiode 304d. In this way, the phosphor screen 300 may be substantially continuously distributed over the photodiode array 302, including the first photodiode 304a, the second photodiode 304b, the third photodiode 304c, the fourth photodiode 304d, the non-detection region 306, the second non-detection region 308, etc.

The adhesion layer 402 can bond the phosphor screen 300 to the plurality of photodiodes 304. In an example, the photodiode array 302 may comprise one or more of the photodiodes 304 disposed on a substrate 430. In another example, the photodiodes 304 may comprise a silicon material, such as silicon p-i-n photodiodes, which can be discreet photodiode elements on the substrate 430, or active photodiode areas created in a monolithic silicon wafer. The photodiode array 302 (e.g., comprising the plurality of photodiodes 304) may be situated proximate an underside of the phosphor screen 300 and may be configured to convert the light energy 406 from the phosphor screen 300 into electrical charge.

In an example, the photodiodes 304 may be operably coupled (e.g., electrically coupled) to one or more data acquisition channels of the data acquisition component 122. For example, the first photodiode 304a may be operably coupled to a first data acquisition channel 432a, the second photodiode 304b may be operably coupled to a second data acquisition channel 432b, the fourth photodiode 304d may be operably coupled to a fourth data acquisition channel 432d, etc. In an example, the photodiodes 304 and the data acquisition channels 432 may be integrated in modules, tiles, etc., to reduce a connection wire path.

In operation, the radiation photons 404 may travel from the radiation source 118 towards the detector array 106 along the y-axis, and impinge upon the phosphor screen 300. In response, the phosphor screen 300 may generate the light energy 406 (e.g., luminescent photons) which is distributed through the phosphor screen 300. Due to the properties of the phosphor material, the light energy 406 can be directed towards the photodiode array 302. Some of the light energy 406 can interact with and/or be reflected by the reflective material 416. In this way, most, if not all, of the light energy 406 generated by the phosphor screen 300 can remain trapped within the phosphor screen 300 and directed towards the photodiode array 302. In an example, the light energy 406 created as a result of x-ray photon interaction with the phosphor material may be distributed in a point spread function at an exit (e.g., bottom surface) of the phosphor screen 300. Lateral spread of these photons may be limited by optical photon attenuation in the material of the phosphor screen 300.

The photodiodes 304 are configured to generate electrical charge in response to being exposed to light. This is due, in part, to the photovoltaic effect of silicon photodiodes. If the energy of photons of the light energy 406 is greater than a bandgap energy of the photodiodes 304, then electrons in the photodiodes 304 can move from a valence band onto a conduction band, and electron-hole pairs will be generated. Free electrons and holes generated within a depletion layer of the photodiodes 304 may drift in an internal field in opposite directions and therefore induce an electric current in an external circuit. The electric current may be sampled during a readout time period by a corresponding data acquisition channel 432 to create a digital output, or view. The data acquisition channel 432 can be of single photon counting (SPC) type or energy integrating type. In the former, the digital output may comprise information about a number of detected radiation photons. In the latter, the digital output may be proportional to radiation energy detected over the sampling time interval.

Figure 5:
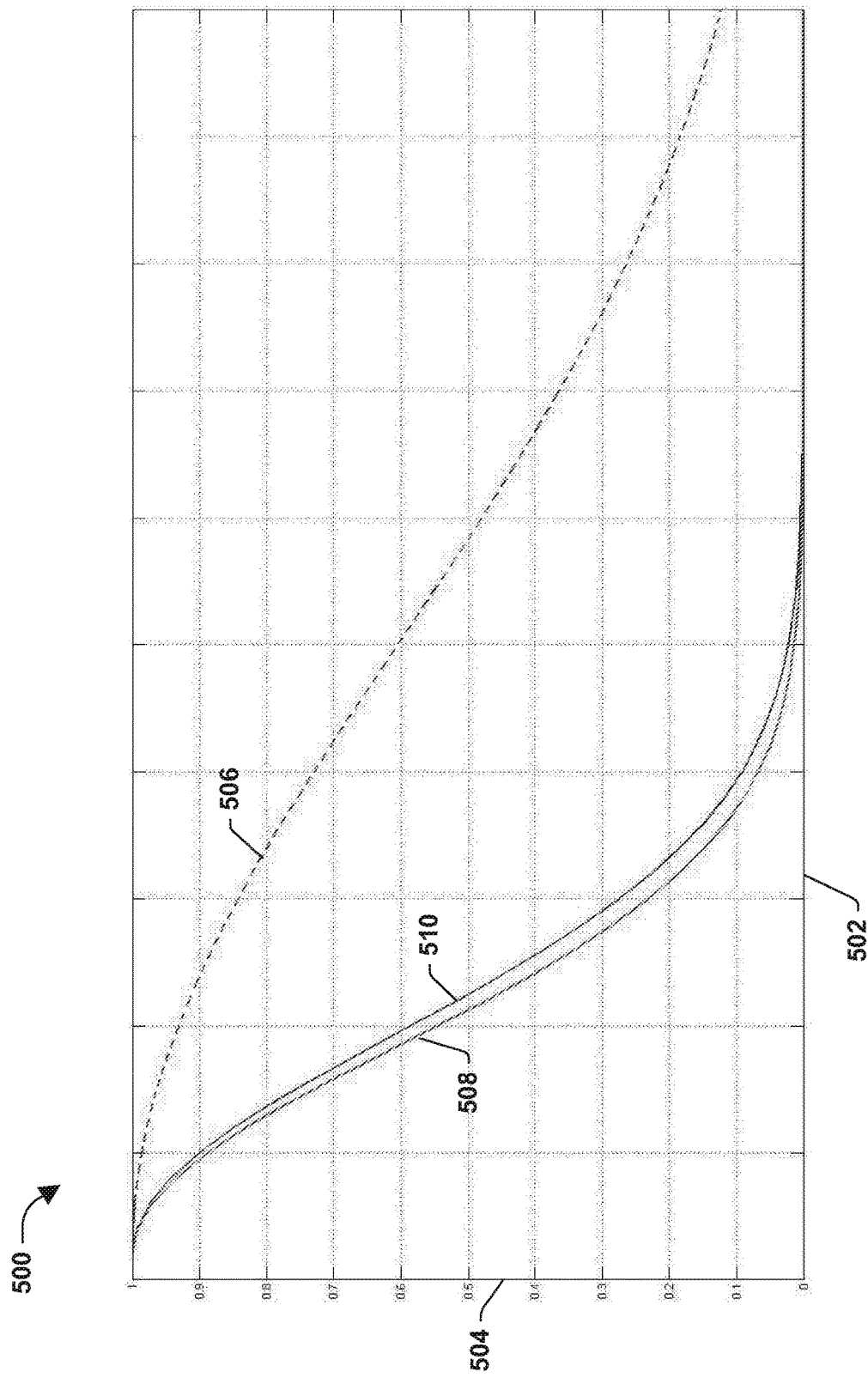
FIG. 5 illustrates a plot of spatial frequency vs. MTF for a detector array.

Referring to FIG. 5, a plot 500 of an image resolution produced by a detector array is illustrated. The x-axis 502 of the plot 500 represents a spatial frequency, while the y-axis 504 of the plot 500 represents an MTF. A prior detector array having pixelated scintillators is represented by line 510. The MTF of the phosphor screen 300 may be represented by line 506. The detector array 106 having the phosphor screen 300 may be represented by line 508. An MTF of the detector array 106 may be a product of the MTF of the screen and the MTF of the pixelated detector. Due to a high resolution of the phosphor screen 300, the effect of MTF on detector resolution is small in comparison to lines 508 and 510. The resolution of the detector array 106 using the phosphor screen 300 can be reduced or increased by modifying the screen area density, dimensions, and pitch of the detector array 106.

The detector array 106 having the phosphor screen 300 described herein provides a number of benefits. The cost of the phosphor screens 300 may be substantially lower than the cost of precisely machined crystalline or ceramic arrays. In addition, due to the phosphor screen 300 being substantially continuously distributed over the photodiodes 304 of the photodiode array 302, ease of manufacturing and assembly of the detector array 106 is improved. This is due, in part, to past detector arrays needing a more precise alignment between the two-dimensional array of scintillator channels and the two-dimensional array of photodiodes. By reducing the manufacturing time and difficulty, the cost to assembly the detector array 106 is likewise reduced. Additionally, as illustrated in FIG. 5, the detector array 106 can produce an image resolution that is comparable to the existing detector arrays.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes", "having", "has", "with", or variants thereof are used, such terms are intended to be inclusive in a manner similar to the term "comprising".

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first set of information and a second set of information generally correspond to set of information A and set of information B or two different or two identical sets of information or the same set of information.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A computed tomography (CT) imaging modality comprising:
    a stator;
    a rotor configured to rotate relative to the stator; and
    a detector array coupled to one of the stator or the rotor and configured to detect radiation photons, the detector array comprising:
        a phosphor screen configured to convert the radiation photons into light energy;
        a photodiode array comprising a plurality of photodiodes configured to convert the light energy into electrical charge, wherein:
            a first photodiode of the plurality of photodiodes is spaced apart from a second photodiode of the plurality of photodiodes to define a non-detection region; and
            the phosphor screen overlies the first photodiode, the second photodiode, and the non-detection region between the first photodiode and the second photodiode, and each of the first photodiode, and the second photodiode directly contacting the phosphor screen.

2. The CT imaging modality of claim 1, wherein the phosphor screen comprises $Gd_2O_2S:Pr$.

3. The CT imaging modality of claim 1, wherein the phosphor screen comprises $Gd_2O_2S:Tb$.

4. The CT imaging modality of claim 1, wherein there is no reflective material between a first portion of the phosphor screen over the first photodiode and a second portion of the phosphor screen over the second photodiode.

5. The CT imaging modality of claim 1, wherein a third photodiode of the plurality of photodiodes is spaced apart from the first photodiode of the plurality of photodiodes to define a second non-detection region.

6. The CT imaging modality of claim 5, wherein:
the first photodiode and the second photodiode are arranged along a first axis; and
the first photodiode and the third photodiode are arranged along a second axis that is non-parallel to the first axis.

7. The CT imaging modality of claim 6, wherein the phosphor screen overlies the third photodiode and the second non-detection region between the first photodiode and the third photodiode.

8. The CT imaging modality of claim 1, wherein the phosphor screen is bonded to the plurality of photodiodes.

9. A computed tomography (CT) imaging modality comprising:
a stator;
a rotor configured to rotate relative to the stator; and
a detector array coupled to one of the stator or the rotor and configured to detect radiation photons, the detector array comprising:
a scintillator configured to convert radiation photons into light energy, wherein the scintillator comprises a phosphor material; and
a photodiode array comprising a plurality of photodiodes configured to convert the light energy into electrical charge, each of the photodiodes of the plurality of photodiodes directly contacting the phosphor material of the scintillator.

10. The CT imaging modality of claim 9, wherein the phosphor material comprises $Gd_2O_2S:Pr$.

11. The CT imaging modality of claim 9, wherein the phosphor material comprises $Gd_2O_2S:Tb$.

12. The CT imaging modality of claim 9, further comprising a radiation source, wherein the radiation source and the detector array are coupled to the rotor.

13. A computed tomography (CT) imaging modality comprising:
a stator;
a rotor configured to rotate relative to the stator; and
a radiation source configured to emit radiation photons, the radiation source coupled to the rotor; and
a detector array coupled to the rotor and configured to detect the radiation photons, the detector array comprising:
a phosphor screen configured to convert the radiation photons into light energy; and
a photodiode array comprising a plurality of coplanar photodiodes configured to convert the light energy into electrical charge, the plurality of photodiodes comprising a first photodiode spaced apart from a second photodiode by a non-detection region, each of the photodiodes of the plurality of photodiodes directly contacting the phosphor screen.

14. The CT imaging modality of claim 13, wherein the detector array comprises a single phosphor screen for the photodiode array directly contacting the phosphor screen, the single phosphor screen having an area density in the range of about 50 to about 500 $mg/cm^2$.

15. The CT imaging modality of claim 13, wherein the phosphor screen has a decay time of between about 2 microseconds to about 4 microseconds.

16. The CT imaging modality of claim 13, wherein the phosphor screen is disposed substantially continuously over the first photodiode, the second photodiode, and the non-detection region between the first photodiode and the second photodiode.

17. The CT imaging modality of claim 16, wherein there is no reflective material between a first portion of the phosphor screen over the first photodiode and a second portion of the phosphor screen over the second photodiode.

18. The CT imaging modality of claim 13, wherein the phosphor screen comprises at least one of $Gd_2O_2S:Tb$ or $Gd_2O_2S:Pr$.

19. The CT imaging modality of claim 13, further comprising an air gap between the first photodiode and the second photodiode.

* * * * *